United States Patent [19]

Zang

[11] Patent Number: 5,759,634
[45] Date of Patent: Jun. 2, 1998

[54] JET VAPOR DEPOSITION OF NANOCLUSTER EMBEDDED THIN FILMS

[75] Inventor: Jian-Zhi Zang, North Branford, Conn.

[73] Assignee: Jet Process Corporation, New Haven, Conn.

[21] Appl. No.: 212,023

[22] Filed: Mar. 11, 1994

[51] Int. Cl.$^6$ ........................................................... C23C 16/00
[52] U.S. Cl. ........................................................... 427/446
[58] Field of Search ...................................... 118/715, 719, 118/725, 730, 729; 427/446

[56] References Cited

U.S. PATENT DOCUMENTS

| | | | |
|---|---|---|---|
| 4,788,082 | 11/1988 | Schmitt | 427/250 |
| 5,256,205 | 10/1993 | Schmitt | 118/718 |
| 5,356,672 | 10/1994 | Schmitt | 427/446 |
| 5,356,673 | 10/1994 | Schmitt | 427/446 |

OTHER PUBLICATIONS

U.S. Ser. No. 07/521,100, May 9, 1990, Schmitt, Halpern, Microwave Plasma Assisted Gas Jet Deposition of Thin Film Material.

"Handbook of Deposition Technologies for Films and Coatings", by Rointan F. Bunshah, et al, Noyes Publishing Company, Park Ridge, New Jersey, 1st edition, 1982, 2nd edition, 1994.

H. Kogelnik and C.V. Shank, Applied Physics Lett., 18 152 (1971).

U.S. Ser. No. 07/670,693, Mar. 18, 1991, Schmitt, Halpern, An Evaporation System for Gas Jet Deposition of Thin Film Materials.

H.P. Weber and R. Ulrich, Applied Physics Lett., 19 38 (1971).

I.P. Kaminow, L.W. Stulz, E.A. Chandros, and C.A. Pryde Applied Optics 11 1563 (1972).

R.L. Fork and Z. Kaplan Appl. Phys. Letters 20 472 (1972).

K.H. Drexhage in "Dye Lasers", F.P. Schaefer, ed., Springer-Verlag, 1973, chapter 4.

D. Avnir, V.R. Kaufman, and R. Reisfeld, J. Non-Crystalline Solids 74 395 (1985).

D. Levy and D. Avnir, Unconventional Photoactive Solids 2nd Int. Conf. Photoact.Solids, Cleveland, OH, 1989; H.Scher, editor; p. 193.

J.D. Mackenzie in Ultrastructure Processing of Ceramics, Glasses and Composites, L.L. Hench and D.R. Ulrich, eds., Wiley-Interscience, 1984, chapter 3.

D.Lo, J.E. Parris, and J.L. Lawless Applied Physics B 55, 365 (1992).

B.L. Halpern, J. Colloid and Interface Science 86 337 (1982).

Primary Examiner—Richard Bueker
Attorney, Agent, or Firm—McCormick, Paulding & Huber

[57] ABSTRACT

An "arrested nucleation" jet vapor deposition system uses sonic jets and moving substrates to produce nanocluster-embedded films in which semiconductor or metal nanoclusters are trapped in a film of hard, inorganic host materials. CdSe films fabricated at high rate and room temperature in accordance with the present invention show unusual nonlinear optical behavior. Nanoclusters have unique size dependent properties and nanocluster based films have applications in optics and electronics.

12 Claims, 4 Drawing Sheets

5,759,634

JET VAPOR DEPOSITION OF NANOCLUSTER EMBEDDED THIN FILMS

The invention described here was made with U.S. Government support under BMDO (Ballistic Missile Defense Organization) contract number DASG60-92-C-0066 and the Government may have rights herein.

CROSS REFERENCE TO RELATED APPLICATIONS

Some of the subject matter herein is disclosed and claimed in the following U.S. patent and pending U.S. patent applications, all of which are incorporated herein by reference.

U.S. Pat. No. 4,788,082 U.S. patent application Ser. No. 06/888,590 U.S. Pat. No. 5,236,205 U.S. patent application Ser. No. 07/817,518

TECHNICAL FIELD

The invention relates to deposition of hard, inorganic films containing nanoclusters of various substances having properties potentially useful in nonlinear optics and related fields, and in particular to apparatus and processes for making these films by Jet Vapor Deposition (JVD).

BACKGROUND OF THE INVENTION

Thin films are critical in modern electronic and photonic devices, and they will provide the basis for future integrated optical-electronic technology as well. Many classical thin film deposition methods exist, as described for example in the standard work, "Handbook of Deposition Technologies for Films and Coatings" by Rointan F. Bunshah, et al, Noyes Publishing Company, Park Ridge, N.J., 1st edition 1982, 2nd edition 1994.

There is considerable interest at the present time in thin films with nonlinear optical properties. One potential, powerful application of these materials is use in an optical computer, to switch lightwaves on and off, or make them change paths, in response to either electric fields or to other lightwaves. Nonlinear materials are described as second order ($c^2$) or third order ($c^3$) according to the dependence of their optical response on the second or third power of the incident electric or electromagnetic field. A key distinction is that molecules in a $c^2$ material must be oriented, while those in a $c^3$ material need not be.

In order to be useful for devices such as waveguides, a nonlinear thin film must exhibit a large value of $c^2$ or $c^3$, low light absorption, negligible light scattering, and have a subpicosecond response time. Among those materials now under consideration, size quantized semiconductor nanocrystallites have shown promisingly large third order effects in bulk; similar behavior is exhibited by some metal nanoclusters, such as gold in glass and polymer hosts.

In addition to nonlinear optical properties, nanoclusters possess unusual and potentially useful electronic, mechanical and chemical properties. Unusual electronic properties arise because cluster diameters in the nanometer range are comparable to electron wavelength. Materials made by consolidating nanoclusters have improved strength: the resultant small grain size provides added resistance to crack propagation. New discoveries about nanocluster materials have gained widespread attention in recent years. Cluster-embedded and consolidated nanocluster thin film, can be expected to have useful and valuable properties; it is therefore of great interest to develop methods for fast, efficient production of cluster embedded films for nonlinear optical and other applications.

There have been a number of attempts to make films with trapped nanoclusters. Ohashi et al have made polymer thin films containing CdS microcrystal by a "precipitation in gel" technique. This process is slow and ill-adapted to high throughput manufacture. The selection of the matrix is limited, and cluster size and number density are difficult to control independently. Hayashi et al has deposited $SiO_2$ containing Ge microcrystals by radio frequency (R.F.) sputtering of an $SiO_2$ target partially covered by Ge microcrystals. This is also a slow process, incompatible with large scale production; an added difficulty is the need to change the target in order to vary the microcrystal size.

Laurent and Kay have reported co-deposition of metal clusters in polymer matrices where the metal was sputtered and the polymer was formed by plasma polymerization in an R.F. reactor. The clusters grew in the matrix by migration and coalescence of metal atoms or smaller clusters. The number density and size of the clusters could be controlled by varying substrate temperature during deposition or post-deposition annealing. This approach gives somewhat easier control over properties than the method of Hayashi et al, but again, sputtering is a slow process that limits manufacturing throughput. In addition, polymeric matrices have less desirable optical and mechanical properties than hard inorganic or ceramic films and the need for plasma in polymer host synthesis provides an environment of high energy ions and radicals in which damage to integrated circuit substrates can be anticipated. Lastly, high vacuum equipment means added capital cost and extended turnaround times.

It is desirable to have a method and apparatus for fabricating semiconductor or metal nanocluster-embedded thin films with controllable properties at an economically attractive rate that is compatible with high throughput waveguide technology. It is also desirable to have a method and apparatus that is adaptable to thin films used in nonlinear optical devices, which require films of high nonlinear response, low absorbency and low scattering. The present invention is drawn towards such method and apparatus.

SUMMARY OF INVENTION

An object of the present invention is to provide system for depositing nanocluster embedded films at high throughput.

Another object of the present invention is to provide a system of the foregoing type that is capable of fabricating thin films with embedded nanoclusters reliably and at a low cost.

Still another object of the present invention is to provide a system of the foregoing type characterized by precise control over both cluster size and number density.

Another object of the present invention is to provide a system of the foregoing type capable of depositing nanoclusters of semiconductors, metals or combinations thereof.

Yet another object of the present invention is to provide a system of the foregoing type capable of utilizing a wide variety of host materials.

According to the present invention, a system for depositing nanocluster embedded films upon a substrate includes a vacuum chamber with a port allowing access to the chamber interior, a vacuum pump for evacuating gas from the chamber and a positioning mechanism for locating and moving a substrate within the chamber and providing relative jet-substrate motion. There is also a jet vapor source, affixed to the chamber port, for admitting carrier gas and an apparatus for entraining with the carrier gas condensible or reactive species for transit to the chamber for ultimate deposition in the form of an inorganic host and a nanocluster guest on the substrate.

DESCRIPTION OF THE PREFERRED EMBODIMENT

Figure 1:
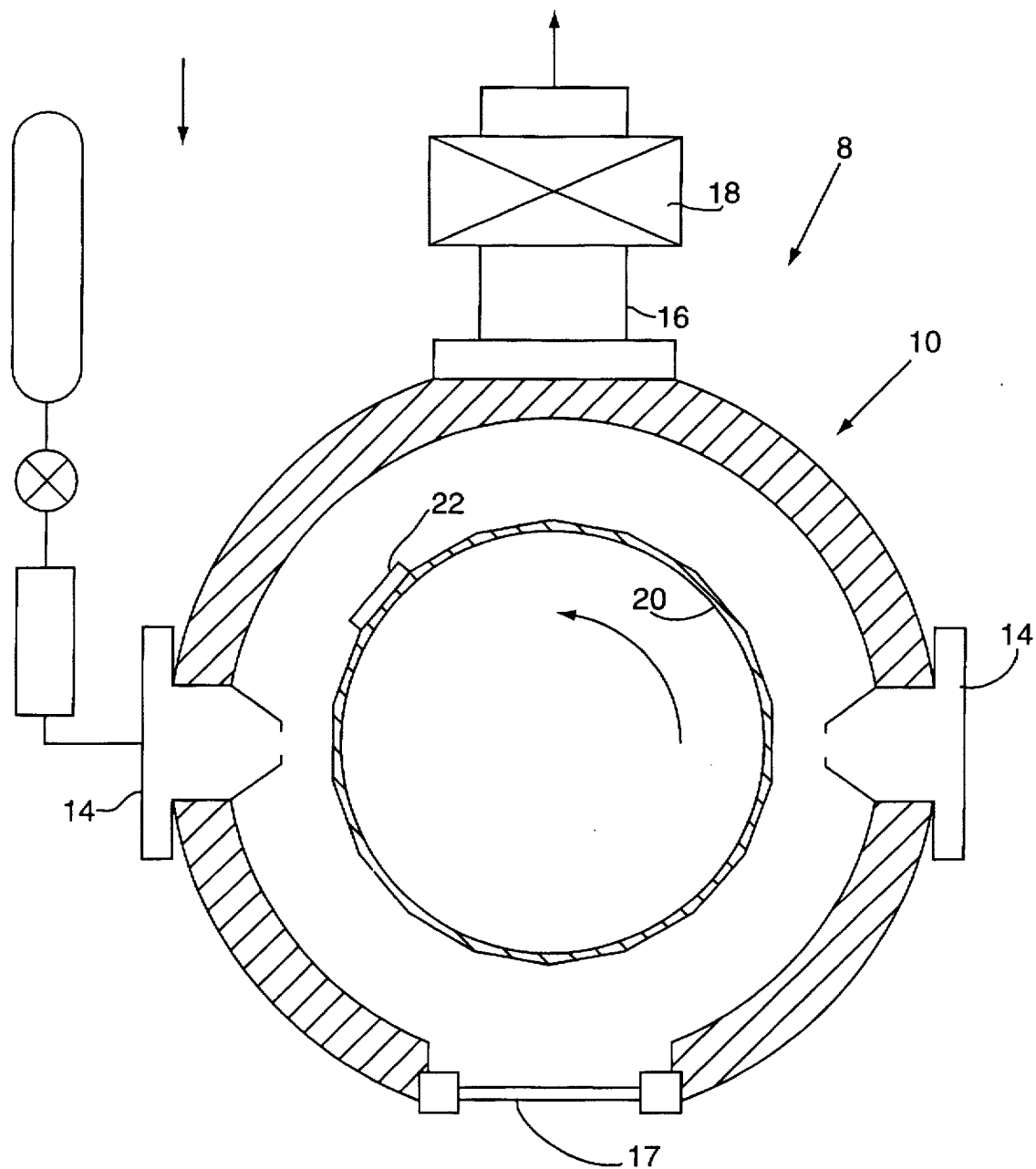
FIG. 1. is a top view of the jet vapor deposition system provided in accordance with the present invention.

The present method and apparatus for generating nanocluster embedded thin films employs Jet Vapor Deposition (JVD) type sources for depositing both the inorganic host and the nanocluster guests. JVD uses collimated sonic jets in low vacuum to carry condensible species and deposit films. In brief, a jet of inert carrier gas propels condensible atoms, molecules or clusters to a substrate downstream. The jet is formed by a nozzle of large exit diameter, several mm to 2 cm, supplied with He or $H_2$ carrier gas, and incorporated in a fast flow, low pressure system. Steady state flow and pressure are sustained by mechanical pumps with speeds ranging from 400 to 20,000 liters/minute; depending on nozzle size, this results in a nozzle pressure $P_n \sim 1-10$ torr, and a downstream pressure $P_d \sim 0.1-1$ torr. For $P_n/P_d > 2$ critical flow obtains; a well collimated jet emerges from the nozzle at the speed of sound, $\sim 10^5$ cm/sec for He. There is latitude in choice of nozzle size, pump speed, and operating pressure range depending on the application.

A vapor source, based on thermal evaporation, glow discharge sputtering, microwave discharge chemistry, laser vaporization, etc, is placed just upstream of the nozzle exit. Evaporated atoms or molecules are entrained by the sonic carrier flow, swept out of the nozzle, and intercepted by a substrate downstream. On a stationary substrate one observes rapid formation of a deposit comparable in area to that of the jet. The boundary of the deposit is sharp; the deposit is non-uniform, however, being thickest at the center.

To obtain uniform deposits over larger areas, either the substrate or the jet is moved. One choice is to mount the substrate on a "carousel" which can both spin and oscillate along its own axis. The carousel motion is computer controlled, so that a variety of motions can be programmed. If the carousel is stationary, atoms deposit in a circular zone as described above. If the carousel spins, the deposit forms a band around it; if the carousel oscillates along its axis as well, its entire surface, (and that of every substrate on it), is efficiently coated to uniform depth.

The versatility of JVD arises in several ways. First, in low vacuum the jet is collimated, and deposition is localized; film growth is fast and efficient. Second, several different jets can be arrayed around the fast moving carousel and substrates; this "multiple jet, mobile substrate" strategy opens a powerful route to reactive synthesis of complex films at submonolayer level but at high rate.

The synthetic capability of JVD can be traced to the pressure range of jet operation: $\sim 1-10$ torr in the nozzle, and $\sim 0.1-1$ torr downstream. At these pressures the jet is collimated and nearly cylindrical as verified by chemiluminescent techniques which make the jet contours visible. Radial diffusion, which tends to flare the jet, is outweighed by near-sonic transport down the jet axis, so that atom deposition is localized and efficient. At much lower pressures, radial diffusion would give a divergent jet; entrained vapor would bypass the substrate and reduce deposition efficiency.

High vacuum physical vapor deposition (PVD) processes such as thermal evaporation do not have JVD's economy of material usage; they give "line of sight" deposition but vapor is wasted in the wrong directions. At much higher pressure, however, gas phase cluster formation and particle growth take place at high vapor inputs; film quality can then be altered. In JVD, clustering will not occur at prevailing pressures and transit times; only single atoms or molecules reach and condense on the substrate even at high deposition rate. JVD's jet sources accordingly operate in an optimal regime: the pressure is high enough to collimate the jet and realize high deposition rates, but low enough to insure arrival of single atoms and molecules at the substrate. Sonic flow means that the vaporization mechanism within a nozzle is unaffected by downstream reactive species. For example, refractory metal sputtering targets inside a nozzle are protected even from atomic oxygen downstream. Jet collimation is particularly advantageous for synthesis; since the jets do not interfere in the gas phase, a moving substrate can reactively "sum" the deposition fluxes from several jets to give complex multicomponents, multilayer, alloy and host-guest films.

The present invention uses a novel "arrested nucleation" JVD approach to make nanocluster embedded films. Most films grow by first forming numerous small nuclei which then join and coalesce to give a continuous layer. With the present invention growth of the nuclei is "arrested" when they reach nanometer size by interrupting the deposition flux. The nanocluster layer is then sealed in with a layer of host material. Periodic repetition of nanocluster deposition and host layer sealing builds up a cluster embedded film. This "arrested nucleation" strategy is a key element of the invention and marks an important point of departure over the prior art.

In the present invention, the jet sources are of sufficient number and of the proper design to deposit nanoclusters, molecules of the host, or the components enabling reactive synthesis of the host for sealing in the nanoclusters. The positioning apparatus is capable of s moving a substrate in such a way that it can sample the flux from any jet. It also enables control of the substrate residence time or exposure time in any jet and thereby the extent of deposition of material from any jet. The resulting film product is the aggregate of components contributed by each jet: the relative proportions and spatial positions of each component in the film will be determined by the relative jet fluxes and by the residence times determined by the substrate positioning system. The net result will be a film in which layers of discrete nanoclusters are trapped in a hard host film.

Figure 2:
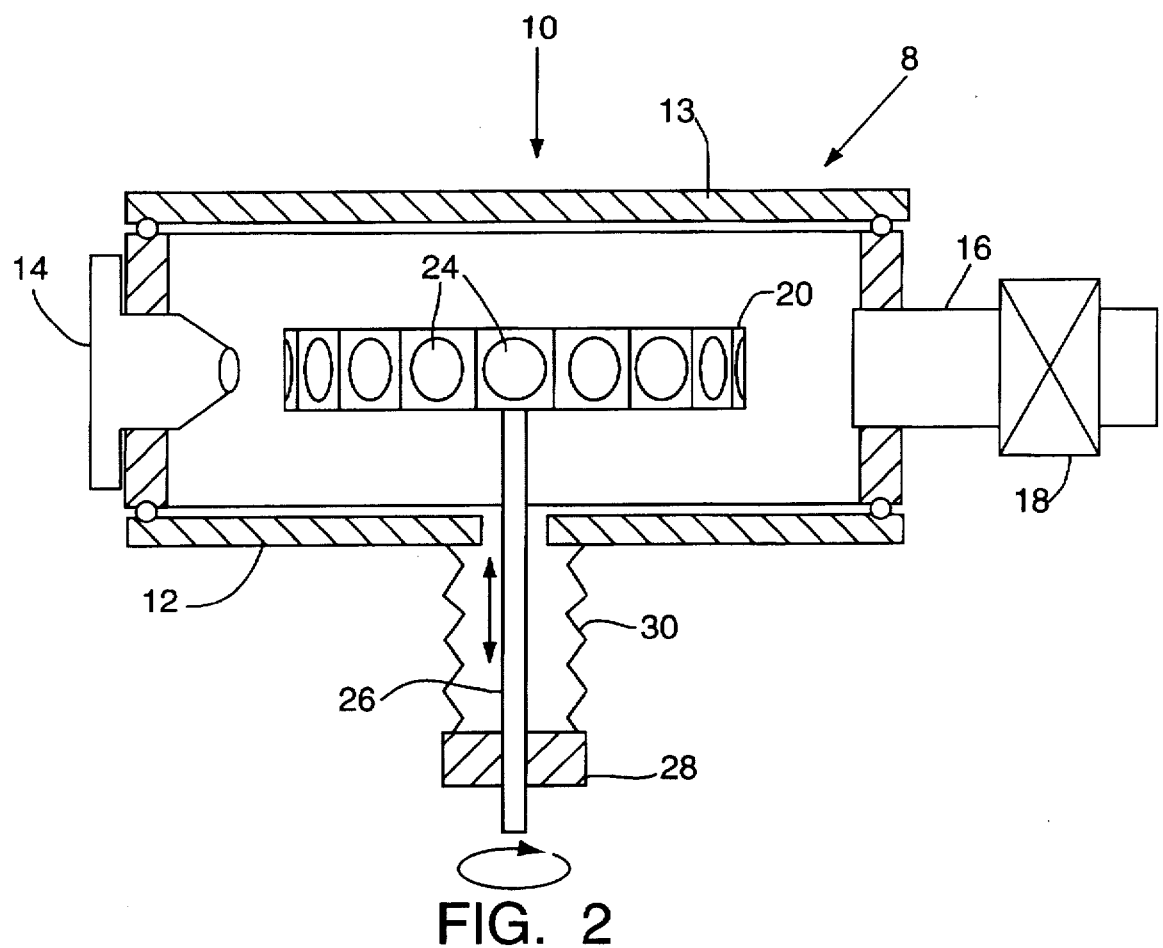
FIG. 2. is a side view of the jet vapor deposition system of FIG. 1.

As shown in FIG. 1, and, FIG. 2, a system 8 provided by the present invention includes a deposition chamber 10 that preferably is a hollow cylinder made from aluminum. There is some freedom in the choice of diameter, height and wall thickness. One chamber has outer diameter 19 inches, height 6 inches, and wall thickness 1 inch, but chambers with smaller diameter and height are useful as well in appropriate applications. The chamber rests on an aluminum baseplate 12 and has a removable aluminum cover 13. This chamber has eight machined ports 14 spaced equidistantly around its circumference, which accommodate standardized 4" flanges; two are shown in FIG. 1. Rubber O-rings provide seals for baseplate, cover, and flanges mounted on the ports. One port is connected to a pumping line 16 which can be closed with a butterfly valve 18. A glass viewport 17 is also shown in FIG. 1.

In the above system, the substrate mounting and motion system is a drum shaped "carousel" 20. It is constructed from a disc 35 cm in diameter and 1 cm thick, into which are machined 18 flat sides each 6 cm long. Square plates 22 6 cm×6 cm×3 mm are attached to each of the eighteen sides, perpendicular to the plane of the disc. "Wells" machined into these plates support the substrates so that the substrate surface is exposed to the jets. The substrates 24 can be of several materials and shapes; typical substrates are 2" silicon wafers, glass plates, and microscope cover glasses. The carousel also contains a centered steel axle 26; the carousel is mounted in the deposition chamber so that its axle is coincident with the chamber axis. The carousel has two degrees of freedom of motion: translation back and forth along the axis, and rotation about the axis. Rotation is effected through a ferrofluidic seal 28 or O-ring seal, and translation is effected through a bellows 30 or O-ring seal, mechanisms familiar to those skilled in the art. Motive power is supplied to the by external stepper motors. It should be emphasized that smaller or larger carousels can be used, consistent with the chamber size, without altering the principle of JVD.

Figure 3:
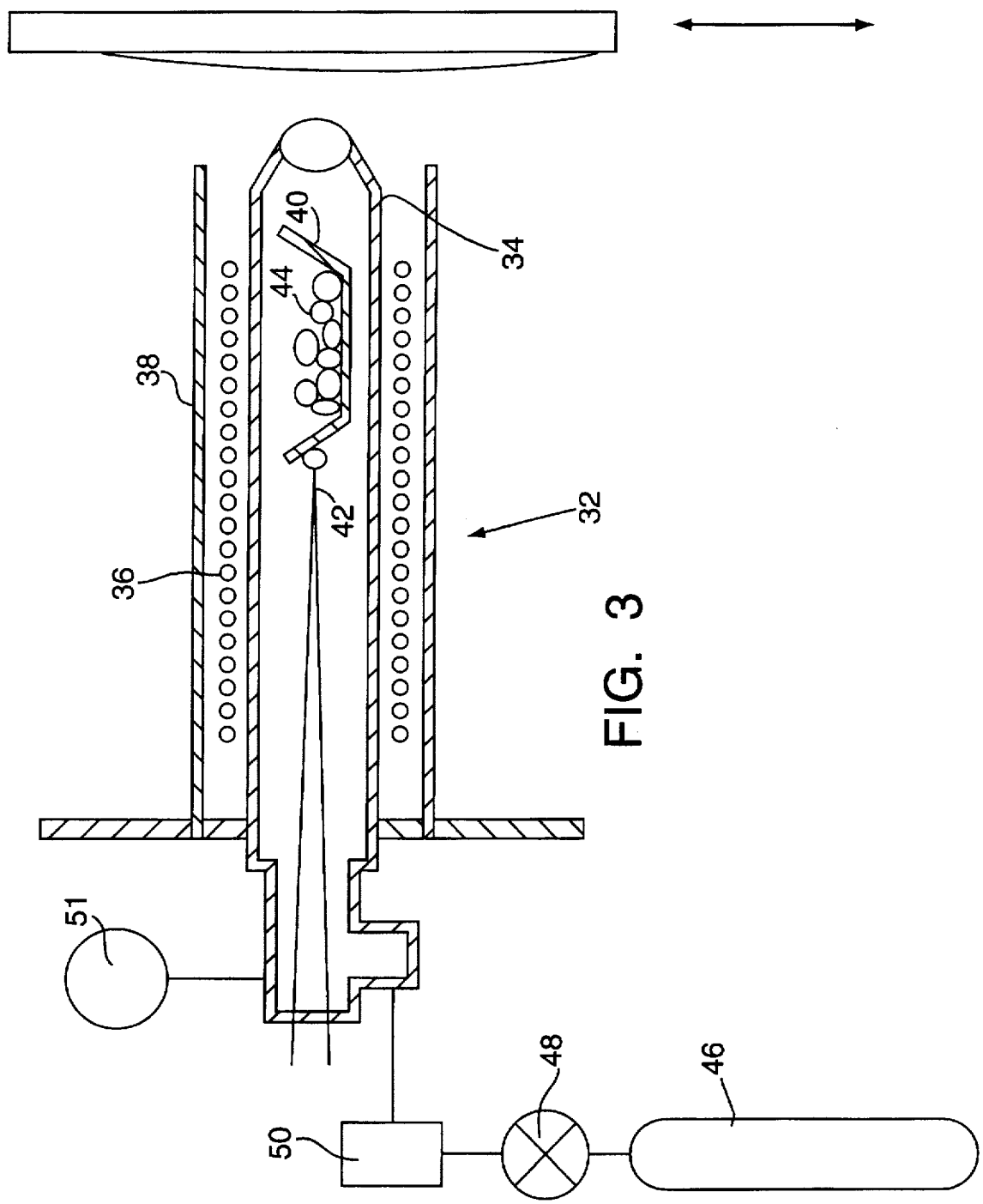
FIG. 3. is an illustration showing an evaporation jet vapor source of nanocluster material used in the jet vapor deposition system of FIG. 1.

One specific jet vapor source 32 of CdSe (cadmium selenide) nanoclusters is shown in FIG. 3. (Well known, conventional chemical abbreviations are often used herein in place of full text names.) It comprises an alumina tube which defines the nozzle 34, a heating coil 36, a metal foil radiation shield 38, a reservoir 40 made from Pt or other unreactive metal foil, and a thermocouple 42. The thermocouple is contained in a small diameter alumina tube (not shown in FIG. 3) mounted along the nozzle axis. The CdSe reservoir is mounted on the end of the thermocouple assembly so that it is located near the nozzle exit, but does not touch the sides of the nozzle. The reservoir is loaded with crystalline or powdered CdSe 44. The metal foil reservoir is shaped to nearly completely enclose the fine powder, with small openings that allow escape of vapor by diffusion while avoiding loss of powder to fast moving gas. Typical dimensions are: nozzle diameter, 1 cm, nozzle orifice diameter, 4 mm, nozzle length, 10 cm. Only a jet source of CdSe based on thermal evaporation has been described above, but it should be clear that other materials, and other modes of vaporization are also possible, without altering the essential principles of the present invention.

The CdSe jet vapor source is supplied with high purity helium or other inert carrier gas from a high pressure cylinder 46. Flow is regulated by a needle valve 48. A commercial getter 50 such as Oxysorb further purifies the carrier. The nozzle pressure is measured by a pressure gauge such as a capacitance manometer 51.

In operation, Helium or other inert carrier gas flows through the nozzle. The preferred nozzle pressures for the CdSe molecule jet lie between 1 and 10 torr, typical in JVD. The heating coil has many closely spaced turns (e.g., 20 mil nichrome wire with turns 2 mm apart) and encases nearly the full length of the nozzle; electric power delivered to the heating coil raises the nozzle temperature and efficiently heats the inflowing gas. The hot gas then heats the CdSe reservoir and thermocouple. In this way the entire nozzle interior, thermocouple and CdSe reservoir are at the same temperature; steady-state flow conditions assure that there are no temperature gradients, and that the CdSe reservoir temperature is stable and uniform. CdSe molecules vaporizing from the reservoir are caught in the carrier gas and swept out of the nozzle with the carrier gas jet to the substrate downstream.

A host such as $BaF_2$, $AlF_3$, or other species that evaporate as intact molecules, can be deposited from a single jet vapor source such as that just described. The reservoir is loaded with powdered inorganic such as $BaF_2$; when the source is in operation molecules of $BaF_2$ are entrained in the carrier gas jet, and deposited downstream. Other hosts, for example, $SiN_x$, require reactive synthesis by two jets: a microwave discharge jet to decompose silane and deposit Si bearing molecular fragments, and an N atom jet to convert the deposit to $SiN_x$ as described in the above referenced patents.

In operation, the CdSe and inorganic host jet sources are mounted in the deposition chamber ports so that each jet flux is aimed perpendicular to substrates mounted on the carousel. As the carousel rotates and translates, each substrate passes in front of each jet in such a way that each element of substrate area is exposed for equal times to the same flux. As a consequence, the film thickness will be uniform over the entire substrate. Moreover, the distribution and relative local concentrations of the CdSe nanoclusters within the inorganic host will also be uniform over the entire substrate.

The CdSe and host jet intensities are chosen to assure that the relative amounts of CdSe and host depositing produces a film in which CdSe is dilute. In order to produce the correct proportions, the jet sources are calibrated individually. Calibration is done by measuring the thickness of the deposit from each jet, CdSe and host, in a given time; this is done with a profilometer such as the Sloan Dektak. Typical deposition rates are: CdSe, 20 nm/minute, $BaF_2$ host, 50 nm/minute.

The critical sequence of events and parameters are as follows. When a substrate on the spinning carousel passes through the CdSe jet, CdSe molecules strike and deposit on it, and CdSe nanoclusters begin to nucleate. The substrate then passes through the host jet, and the CdSe nuclei are buried by a continuous host layer. The number and final size of the CdSe crystallites are determined by the CdSe and host jet intensities, the carousel rotation rate, and the substrate temperature. Higher carousel rotation rates give smaller cluster sizes, other conditions being equal, since the nuclei have less time to grow before burial by the host. The carousel is rotated sufficiently fast to assure that less than a monolayer of CdSe nanoclusters deposits as the substrate passes through the guest jet. At the same time, the rotation is slow enough to assure that many monolayers of host will deposit per pass. Typical operating conditions are: carousel rotation frequency: 5 to 100 RPM; axial scan frequency: 1 scan/min; scan amplitude: 3 inches. An important feature of the invention is that film growth can be carried out at room temperature.

Figure 4:
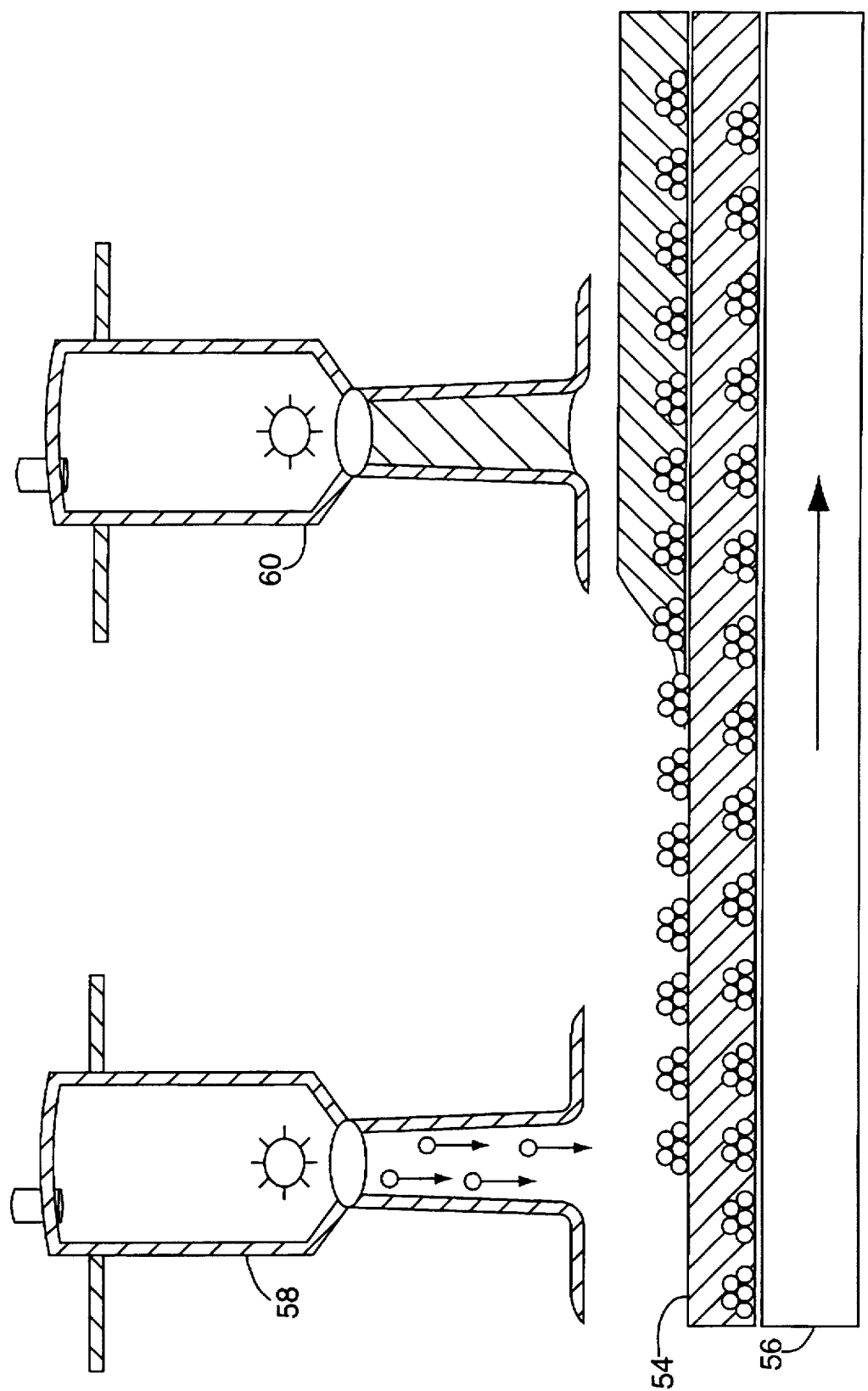
FIG. 4. shows schematically the growth of a cluster embedded film by sequential deposition of nanocluster and host layers by a system provided in accordance with the present invention.

FIG. 4 shows a CdSe cluster embedded host film 54 being built up on a moving substrate 56 via deposition from a jet supplying the organic guest 58 and a jet supplying the inorganic host 60. The nanocluster layer deposits as a sub-monolayer in which the individual clusters are separated; the inorganic host is a multilayer deposit typically 1–10 nanometers thick. FIG. 4 shows deposition of nanoclusters on top of a previously deposited host layer and their subsequent burial by the next host layer.

The present method and apparatus has been used to make CdSe cluster embedded films using the following hosts:

$BaF_2$, $SiN_x$, $SiO_2$, $ZrO_2$, $TaO_2$, KI and NaCl. The presence of nanoclusters was verified in several ways. Color change with carousel spin rate provides an indication. The color of cluster embedded films depends strongly on cluster size. When films are deposited at increasing carousel rotation rate, the color is "blue shifted" from brown to red, as expected. There is a color change on annealing. For example, a red film (small clusters) turns brown when annealed at 250° C., indicating that small clusters have aggregated to larger clusters. With Transmission electron microscopy: nanoclusters (smaller than 10 nm) are directly visible. Moreover, selected area electron diffraction (SAD) results show a strong ring pattern corresponding to the cubic form of CdSe. With optical absorption spectroscopy the absorption edge is shifted to the blue as the carousel rotation speed increased, consistent with the presence of smaller nuclei. Nonlinear optical measurements show the strong nonlinear effects expected for semiconductor nanoclusters.

It can be seen that the present invention provides a way to deposit nanocluster embedded ceramic thin films potentially useful for optical and electronic applications. The use of JVD nanocluster and host nozzle sources in a novel "arrested nucleation" approach provides many advantages over methods attempted to date. The deposition rates and throughputs are larger than for any other method, and deposition is carried out in an apparatus that is simpler, more reliable, and less costly than in other methods. The method allows deposition of nanoclusters of semiconductors or metals in a wide variety of hard, inorganic host with control over cluster size and number density. The present invention provides the only method suitable for both versatile research and for high throughput manufacture.

Similarly, although the invention has been shown and described with respect to a preferred embodiment thereof, it should be understood by those skilled in the art that various other changes, omissions and additions thereto may be made therein without departing from the spirit and scope of the present invention. For example, the nozzles for generating nanoclusters and host may have other sizes and shapes, and rely on different vapor production mechanisms. The moving carousel may be of larger or smaller diameter and height, and its rotational speed may be higher or lower. The carousel may be held stationary, and the nozzle assemble itself moved relative to the substrates.

I claim:

1. A method for vapor deposition of a film upon a substrate having a plurality of stable nanometer sized molecular clusters of a minority first material embedded within a majority host second material, said method comprising the steps of:

providing a vacuum chamber having a plurality of ports allowing for access to a vacuum chamber interior;

positioning the substrate within said vacuum chamber interior at a first substrate position;

depositing a nanocluster component of the film on said substrate by providing controlled entry of a first material gas into the interior of the vacuum chamber by means of a first gas jet apparatus affixed to a first vacuum chamber port, said first gas jet apparatus including:

a first nozzle having an interior cavity for providing, from a first nozzle tip, a supersonic jet of gas directly towards a substrate first position for a time in excess of a time needed to allow molecules of said first material to combine on said surface into first molecule nanoclusters with each of said nanoclusters spaced from one another but in a time less than a time needed to deposit a continuous layer of said first material wherein adjacent ones of said nanoclusters have coalesced;

a means for providing carrier gas within said first nozzle interior cavity; and a means for providing first material reactant gas within said first nozzle interior cavity;

moving, relative to said gas jet apparatus, said substrate from said substrate first position to a substrate second position;

depositing a host portion of the film on said substrate by providing controlled entry of a host reactant gas into the interior of the vacuum chamber by means of a host gas jet apparatus affixed to a second vacuum chamber port, said host gas jet apparatus including:

a host nozzle having an interior cavity for providing, from a host nozzle tip, a supersonic jet of gas directly towards said substrate second position for at least a time needed to deposit a continuous layer of host material such that said host material substantially encompasses said nanoclusters, a means for providing carrier gas within said host nozzle interior cavity; and a means for providing host reactant gas within said host nozzle interior cavity; and evacuating gas from said vacuum chamber to maintain a pressure in said vacuum chamber.

2. The method of claim 1 further comprising the steps of presenting said first material to said substrate in a jet of substantially single molecules, thereby ensuring said first molecule clusters form only on said substrate surface.

3. The method of claim 1 further comprising the steps of translating said substrate between said first and second substrate positions within a time in excess of a time needed to allow molecules of said first material to combine on said surface into first molecule nanoclusters with each of said nanoclusters spaced from one another but in a time less than a time needed to deposit a continuous layer of said first material wherein adjacent ones of said nanoclusters have coalesced.

4. The method of claim 1 further comprising the step of translating said substrate between said first and second substrate positions to ensure the film is comprised of chemical reaction products of said first and second reactant gasses.

5. The method of claim 1 further comprising the step of providing said substrate substantially at room temperature.

6. The method of claim 1 wherein said first material is nongaseous and said method further comprises the steps of;

providing said first gas jet apparatus with a means for holding said first material within said carrier gas jet such that nongaseous components remain in said holding means; and providing a means for evenly heating said first material holding means such that first material molecules are presented to said carrier gas jet.

7. The method of claim 6 further comprising the steps of;

providing said first material in powdered form; and providing said holding means with an enclosure having a plurality of spaced openings so as to prevent said powdered first material from being blown from said enclosure by said carrier gas jet.

8. The method of claim 1 further comprising the steps of;

providing said substrate to an initial substrate position;

depositing an initial host portion of the film on said substrate by providing controlled entry of an initial host material reactant gas into the interior of the vacuum chamber by means of an initial host gas jet apparatus affixed to a third vacuum chamber port, said initial host gas jet apparatus including:
- an initial host nozzle having an interior cavity for providing, from an initial host nozzle tip, a supersonic jet of gas directly towards said substrate initial position for at least a time needed to deposit a continuous layer of initial host material, said initial host nozzle tip being recessed from said vacuum chamber port;
- a means for providing carrier gas within said initial host nozzle interior cavity; and
- a means for providing initial host material reactant gas within said initial host nozzle interior cavity; and
- moving, relative to said initial gas jet apparatus, said substrate from said initial substrate position to said first substrate position.

9. The method of claim 3 further comprising the steps of providing a means for interrupting the presentation of said first gas jet while said substrate is in registration therewith, thereby ensuring the film includes a first host material layer, a host—first material layer and a second host material layer.

10. A method for depositing a film having first and second chemical components upon a substrate, said method comprising the steps of:
- providing a vacuum chamber having a plurality of ports allowing for access to a vacuum chamber interior.
- positioning the substrate on a translation fixture within said vacuum chamber interior at a first position;
- depositing a majority host chemical component of the film on said substrate by providing controlled entry of a first chemical component gas into the interior of the vacuum chamber by means of a first gas jet apparatus affixed to a first vacuum chamber port, said first gas jet apparatus including:
  - a first gas jet apparatus nozzle having an interior cavity;
  - a first gas jet apparatus means for providing carrier gas within said first nozzle interior cavity and
  - a first gas jet apparatus means for providing a supersonic jet of first chemical component gas from a first nozzle tip configured to provide said first chemical component gas directly towards said substrate first position;
- depositing a nanocluster chemical component of the film on said substrate by providing controlled entry of a second chemical component gas into the interior of the vacuum chamber by means of a second gas jet apparatus affixed to a second vacuum chamber port, said second gas jet apparatus including:
  - a second gas jet apparatus nozzle having an interior cavity;
  - a second gas jet apparatus means for providing carrier gas within said second outer nozzle interior cavity;
  - a second gas jet apparatus means for providing a supersonic jet of second chemical component gas substantially at room temperature from a second nozzle tip configured to provide said second chemical component gas directly towards said substrate second position for a time in excess of a time needed to allow molecules of said second chemical component to combine on said surface into first molecule nanoclusters with each of said nanoclusters spaced from one another but in a time less than a time needed to deposit a continuous layer of said first chemical component wherein adjacent ones of said nanoclusters have coalesced; and
- evacuating gas from said vacuum chamber to maintain a pressure in said vacuum chamber.

11. The method of claim 10 further comprising the steps of recessing said first and second nozzle tips from said vacuum chamber port within a respective one of said gas jet apparatus means interior cavities.

12. The method of claim 10 further comprising the steps of creating a multi-layer film including the steps of repeatedly depositing said majority host and nanocluster chemical components.

* * * * *

UNITED STATES PATENT AND TRADEMARK OFFICE
CERTIFICATE OF CORRECTION

PATENT NO. : 5,759,634
DATED : June 2, 1998
INVENTOR(S) : Jian-Zhi Zhang

It is certified that error appears in the above-identified patent and that said Letters Patent is hereby corrected as shown below:

Column 7, line 48, delete "dusters" and insert --clusters--.

Signed and Sealed this

Twenty-seventh Day of October, 1998

Attest:

BRUCE LEHMAN

Attesting Officer

Commissioner of Patents and Trademarks